US010816483B2

United States Patent
Rankin et al.

(10) Patent No.: US 10,816,483 B2
(45) Date of Patent: Oct. 27, 2020

(54) DOUBLE PASS DILUTED ULTRAVIOLET RETICLE INSPECTION

(71) Applicant: GLOBALFOUNDRIES INC., Grand Cayman (KY)

(72) Inventors: Jed H. Rankin, Richmond, TX (US); Guoxiang Ning, Clifton Park, NY (US); Paul W. Ackmann, Gansevoort, NY (US); Jung-Yu Hsieh, Ballston Spa, NY (US); Ming Lei, Bellevue, WA (US)

(73) Assignee: GlobalFoundries Inc., Grand Cayman (KY)

(*) Notice: Subject to any disclaimer, the term of this patent is extended or adjusted under 35 U.S.C. 154(b) by 161 days.

(21) Appl. No.: 16/233,336

(22) Filed: Dec. 27, 2018

(65) Prior Publication Data

US 2020/0209166 A1 Jul. 2, 2020

(51) Int. Cl.
*G01N 21/956* (2006.01)
*G03F 7/20* (2006.01)
*G06T 7/00* (2017.01)

(52) U.S. Cl.
CPC ......... *G01N 21/956* (2013.01); *G03F 7/7065* (2013.01); *G06T 7/001* (2013.01); *G06T 2207/30148* (2013.01)

(58) Field of Classification Search
CPC ..... G01N 21/956; G03F 7/7065; G06T 7/001; G06T 2207/30148
See application file for complete search history.

(56) References Cited

U.S. PATENT DOCUMENTS

| 2008/0239290 | A1* | 10/2008 | Watanabe | ............ | G01N 21/956 356/73 |
| 2013/0077086 | A1* | 3/2013 | Chuang | ................. | G02F 1/3501 356/51 |
| 2013/0336574 | A1 | 12/2013 | Nasser-Ghodsi et al. | | |
| 2016/0291479 | A1 | 10/2016 | Feijen et al. | | |

FOREIGN PATENT DOCUMENTS

| DE | 102009041405 A1 | 3/2011 |
| WO | 2011029535 A2 | 3/2011 |

* cited by examiner

*Primary Examiner* — Siamak Harandi
(74) *Attorney, Agent, or Firm* — Anthony Canale; Hoffman Warnick LLC

(57) ABSTRACT

A reticle inspection system and related method are disclosed. The system includes a concave spherical mirror positioned adjacent a side of the reticle that is configured to reflect inspection light transmitted through the reticle back towards and through the reticle. A sensor is configured to create at least one of: a first inspection image representative of a circuit pattern of the reticle based on transmission of the inspection light through the first side of the reticle and a reflection thereof by the concave spherical mirror through the second side of the reticle, and a second inspection image representative of the circuit pattern of the reticle based on the reflection of the inspection light from the first side of the reticle. A controller is configured to identify a defect in the reticle based on at least one of the first inspection image and the second inspection image.

12 Claims, 5 Drawing Sheets

US 10,816,483 B2

DOUBLE PASS DILUTED ULTRAVIOLET RETICLE INSPECTION

BACKGROUND

The present disclosure relates to reticle inspection, and more specifically, to a reticle inspection system and related method using a double pass approach using a concave spherical mirror.

Advanced manufacturing of integrated circuits (IC) requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Photolithography is a technique for transferring an image rendered on one media onto another media photographically. Photolithography techniques are widely used in semiconductor fabrication. Typically, a circuit pattern is rendered as a positive or negative mask image on a reticle, e.g., a patterned, opaque layer of chrome on a glass substrate perhaps with a thin-film protective membrane thereover (pellicle). The circuit pattern is then projected onto a silicon substrate coated with photosensitive materials (e.g., PR). Radiation impinges on the masked surface to chemically change those areas of the coating exposed to the radiation, usually by polymerizing the exposed coating. The un-polymerized areas are removed, being more soluble in the developer than the polymerized regions, and the desired image pattern remains.

In order to ensure accurate dimensions of circuit structures are created, the reticles used to create the masks are carefully inspected to identify defects in the circuit pattern. If defects appear in the circuit pattern, corrections can be made prior to or during IC manufacture, e.g., via optical proximity correction. Conventionally, as shown in FIG. 1, reticle inspection includes using an optics-based reticle inspection system 10 that evaluates a reticle 12 based on both transmission of inspection light 14 through reticle 12, and reflection of inspection light 16 from reticle 12. In each case, a sensor array 20 is positioned to sense the light and create an image (optics-based) for identification of defects. That is, the system is capable of transmitting light at or through the reticle and sensing the transmitted or reflected light, e.g., laser light at 193 nanometer wavelength, to identify defects in the reticle. Current reticle inspection systems 10 and processes are fairly complex requiring optical splitters 22, transmission optics 24 and various mirrors 26 to transmit light 14 through reticle 12 from one side 30 thereof. The systems also include other optical splitters 32 to transmit light at reticle 12 from an opposite side 34 and sense reflected light 16 therefrom. During inspections, loss of intensity (e.g., 50%) in the inspection light is common and the resolution is limited. Both issues negatively impact the inspection.

SUMMARY

A first aspect of the disclosure is directed to a reticle inspection system, comprising: an inspection light source providing an inspection light, the inspection light being deep ultraviolet (DUV) light; a reticle holder configured to hold a reticle in a path of the inspection light such that the inspection light impacts the reticle on a first side; a concave spherical mirror positioned adjacent a second side of the reticle opposite the first side of the reticle, the concave spherical mirror configured to reflect the inspection light transmitted through the reticle back towards and through the reticle; a sensor configured to create at least one of: a first inspection image representative of a circuit pattern of the reticle based on transmission of the inspection light through the first side of the reticle and a reflection thereof by the concave spherical mirror through the second side of the reticle, and a second inspection image representative of the circuit pattern of the reticle based on the reflection of the inspection light from the first side of the reticle; and a controller coupled to the sensor and configured to identify a defect in the reticle based on at least one of the first inspection image and the second inspection image.

A second aspect of the disclosure related to a method for inspecting a reticle for a defect, the method comprising: transmitting an inspection light through a first side of the reticle, the inspection light including deep ultraviolet (DUV) light; creating a first inspection image representative of a circuit pattern of the reticle based on a reflection of the transmitted inspection light from the first side of the reticle; using a concave spherical mirror, reflecting the transmitted inspection light having passed through the first side of the reticle through a second side of the reticle, creating a reflected transmitted inspection light; creating a second inspection image representative of the circuit pattern of the reticle based on the reflected transmitted inspection light; and identifying a defect in the reticle based on at least one of the first inspection image and the second inspection image.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
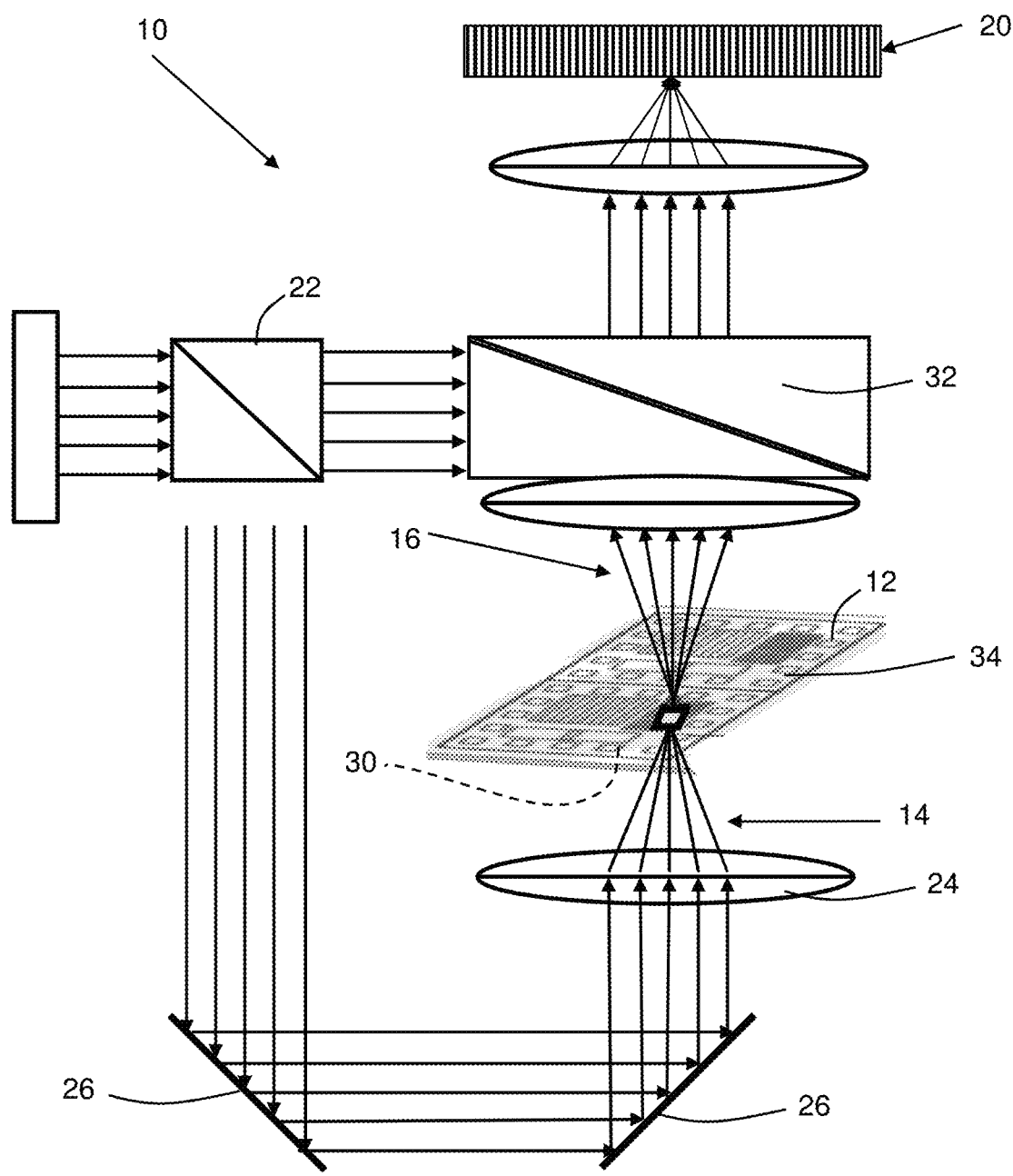
FIG. 1 shows a schematic side view of a conventional reticle inspection system.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a reticle inspection system that employs a double pass transmission of inspection light using a concave spherical mirror instead of various optical splitters and mirrors to create a mirror-reflected transmission inspection image. The system also creates a reflected inspection image of reticle-reflected inspection light. Consequently, the system can obtain inspection images after reflecting the inspection light from a first side of the reticle, and transmitting the inspection light through the reticle for reflection back through the reticle using the concave spherical mirror. The reticle inspection system is simpler than conventional reticle inspection systems (e.g., not as many mirrors or focusing lenses), and does not exhibit the intensity losses of conventional reticle inspection systems, resulting in more improved identification of defects.

Figure 2:
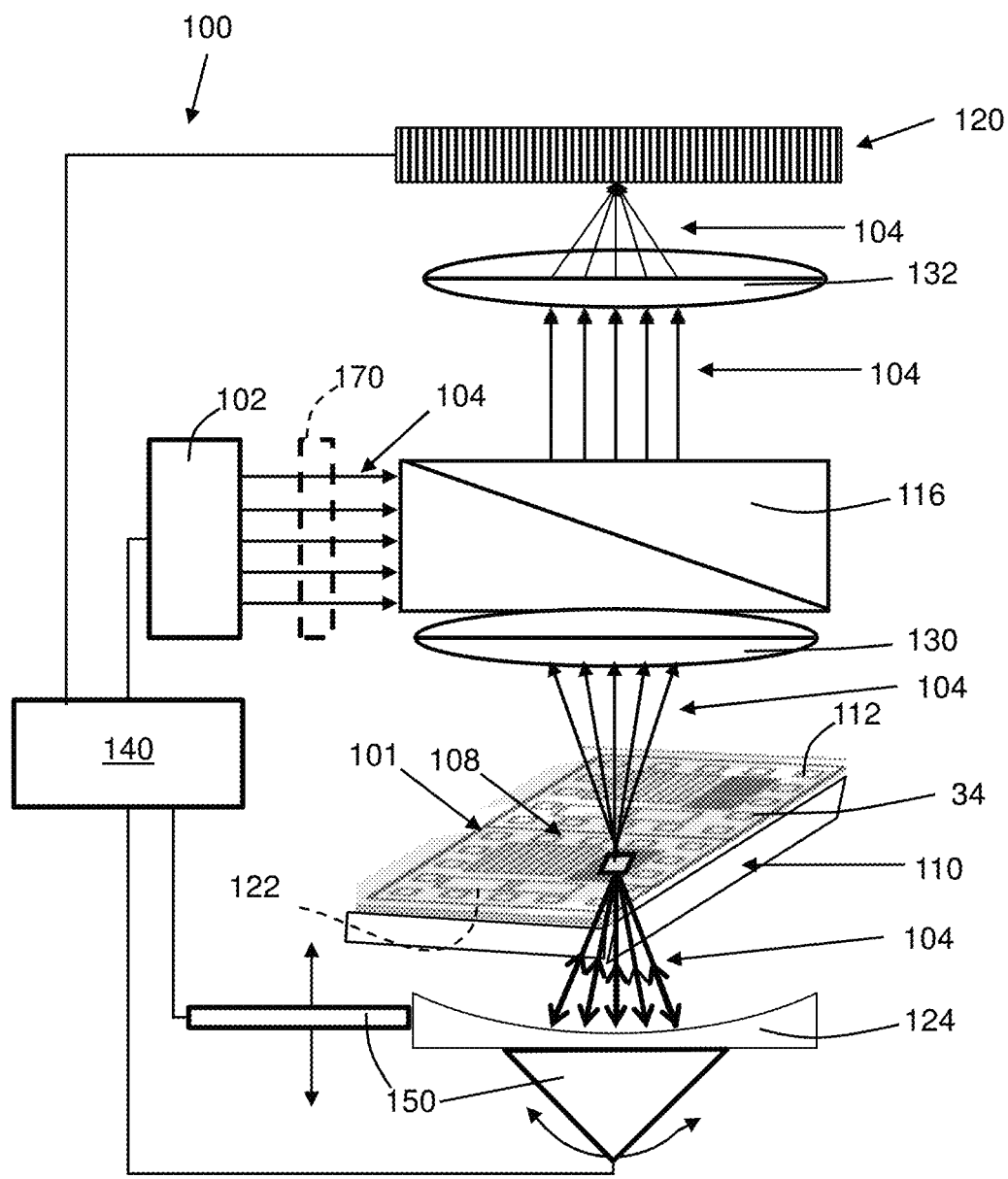
FIG. 2 shows a schematic side view of a reticle inspection system exhibiting various inspection light paths, according to embodiments of the disclosure.

FIG. 2 shows a schematic side view of a reticle inspection system 100 for inspecting a reticle 101 according to embodiments of the disclosure. FIG. 2 shows various forms of inspection light 104 paths therein superimposed in position. As will be described, FIGS. 3 and 4, separate some of the inspection light paths to more clearly describe the disclosure. Reticle inspection system 100 (hereafter "system 100") includes an inspection light source 102 providing an inspection light 104. Inspection light source 102 may include any now known or later developed reticle inspection light creating source, e.g., laser system, capable of creating inspection light 104. Inspection light 104 may be, for example, deep ultraviolet (DUV) light of about 248 nanometers (nm) or 193 nm. Reticle 101 may include any now known or later developed form of a deep ultraviolet (DUV) reticle. As understood in the DUV reticles include a circuit pattern rendered as a positive or negative mask image, e.g., a binary mask with a patterned, opaque layer of chrome creating the circuit pattern on a glass substrate, and perhaps with a thin-film protective membrane thereover (pellicle, not shown).

System 100 also includes a reticle holder 110 configured to hold reticle 101 in a path of inspection light 102 such that inspection light 104 may impact reticle 101 from a first side 112 or a second side 122 thereof. Reticle holder 110 may include any now known or later developed system for accepting, positioning and conveying reticle 110 for inspection, e.g., a plate with an open center, a grasping system, etc.

As used herein, "inspection light 104" will be used to reference the inspection light generically. As will be introduced, the inspection light is referenced at its different locations and stages of manipulation caused by reticle 101 and/or other optics by different terminology, e.g., transmitted inspection light, mirror-reflected transmission inspection light, and/or reticle-reflected inspection light. As understood in the art, as inspection light 104 is transmitted through or reflected from reticle 101, it conveys the shapes of circuit pattern 108 of reticle 101, which can be captured in a digital image and analyzed for defects. "Circuit pattern" 108, as used herein, indicates any full or partial circuit pattern formed on reticle 101.

As indicated, inspection light 104 from inspection light source 102 may be split or redirected by an optical splitter/ mirror 116 towards reticle 101. Optical splitter/mirror 116 may not be necessary in all instances where inspection light source 102 can be more directly aimed at reticle 101 such that inspection light 104 can impact first side 112 of reticle 101.

System 100 also includes a sensor 120 configured to sense inspection light 104 and create respective inspection images thereof indicative of circuit pattern 108 of reticle 101. The inspection images may be analyzed to identify defects in reticle 101, in a known fashion. Sensor 120 may include any now known or later developed digital imaging array configured to create an image. For example, sensor 120 may include one or more charge couple devices (CCDs).

Figure 3:
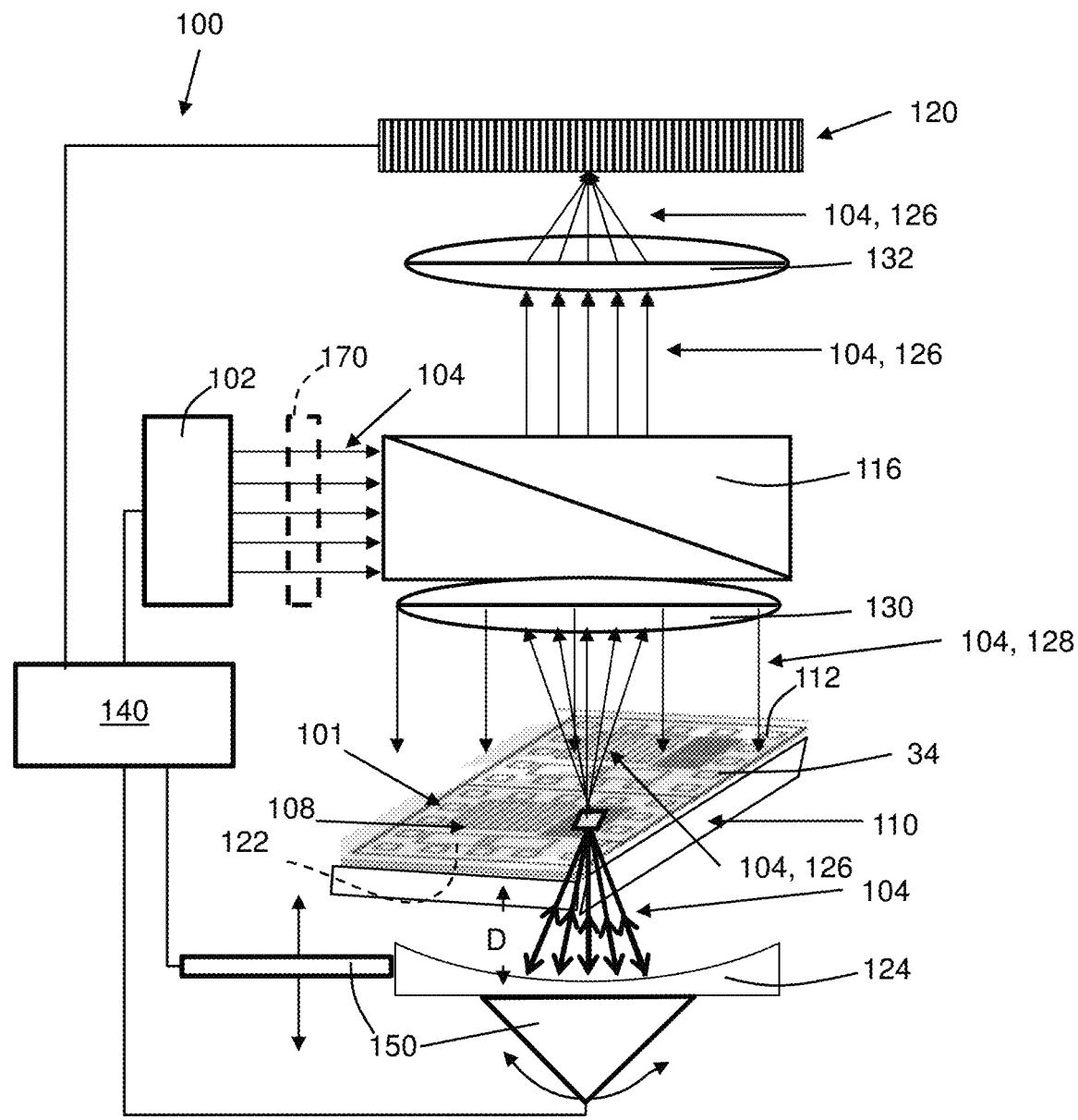
FIG. 3 shows a schematic side view of a reticle inspection system exhibiting a mirror-reflected transmission inspection light path, according to embodiments of the disclosure.
Figure 4:
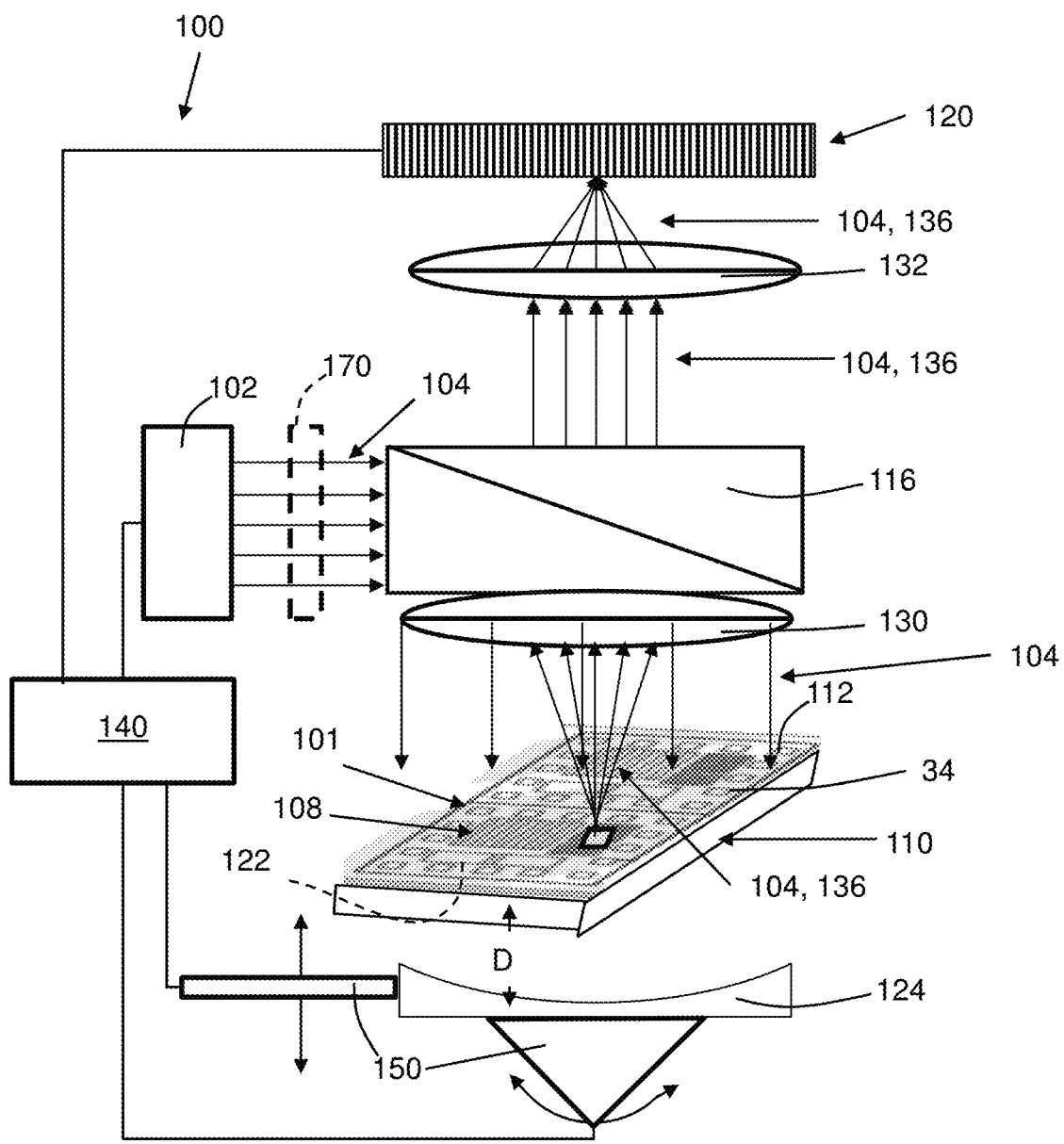
FIG. 4 shows a schematic side view of a reticle inspection system exhibiting a reticle-reflected inspection light path, according to embodiments of the disclosure.

FIG. 3 shows a schematic side view of system 100 exhibiting a mirror-reflected transmission inspection light 126 path, according to embodiments of the disclosure, and FIG. 4 shows a schematic side view of system 100 exhibiting a reticle-reflected inspection light 130 path, according to embodiments of the disclosure. In contrast to conventional reticle inspection systems, system 100 includes a concave spherical mirror 124 positioned adjacent, i.e., near or below, second side 122 of reticle 101 opposite first side 112 of the reticle. As shown in FIG. 3, concave spherical mirror 124 is configured to reflect transmitted inspection light 128 transmitted through reticle 112 (from inspection light source 102) back towards and through reticle 112, creating mirror-reflected transmission inspection light 126. As can be appreciated, mirror-reflected inspection light 126 conveys the shapes of circuit pattern 108 on reticle 101 as would be created by conventional transmission inspection light 14 (FIG. 1).

Figure 5:
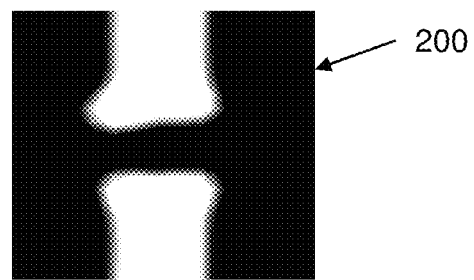
FIG. 5 shows an illustrative inspection image based on mirror-reflected transmission inspection light.

As shown in FIG. 3, sensor 120 is configured to create an inspection image 200 (FIG. 5) representative of circuit pattern 108 of reticle 101 based on transmission of the inspection light 128 through first side 112 of reticle 101, and a reflection thereof by concave spherical mirror 124 through second side 122 of the reticle. That is, a double pass of inspection light 104 through reticle 101. The light communicated to sensor 120 in this stage is referred to as mirror-reflected transmission inspection light 126, and mirror-reflected transmission inspection image 200 (FIG. 5) is based on mirror-reflected transmission inspection light 126. As shown in FIG. 4, sensor 120 may also be configured to create inspection image 202 (FIG. 6) representative of circuit pattern 108 of reticle 101 based on the reflection of inspection light 136 from first side 112 of reticle 101, i.e., based on reticle-reflected inspection light 136. The light communicated to sensor 120 in this stage is referred to as reticle-reflected inspection light 136, and inspection image 202 (FIG. 6) is based on reticle-reflected inspection light 136. As understood in the art, reticle-reflected inspection light 136 conveys the shapes of circuit pattern 108 on reticle 101. Consequently, as shown in FIG. 3, sensor 120 is capable of creating inspection image 202 (FIG. 6) based on reflection of the inspection light 104 from first side 112 of reticle 101, and an inspection image 200 (FIG. 5) based on transmission of inspection light 128 through reticle 101 and reflection back through the reticle using concave spherical mirror 124.

As understood in the art, mirror-reflected transmission inspection image 200 (FIG. 5) and reticle-reflected inspection image 202 (FIG. 6) are negatives of one another, and may be used together or alone to identify defects in reticle 101.

As shown in FIG. 2, each form of inspection light 104 may be employed in nearly simultaneous fashion. In this case, sensor 120 may differentiate light, i.e., mirror-reflected transmission inspection light 126 (FIG. 3), for creating inspection image 200 (FIG. 5) of reticle 101, and light, i.e., reticle-reflected inspection light 136 (FIG. 4), for creating inspection image 202 (FIG. 6) based on a difference in a travel time of the inspection light for each. More particularly, mirror-reflected transmission inspection light 126 (FIG. 3) has a longer travel path than reticle-reflected inspection light 136 (FIG. 4), thus allowing sensor 120 to identify which light is which and create the appropriate inspection image.

Figure 6:
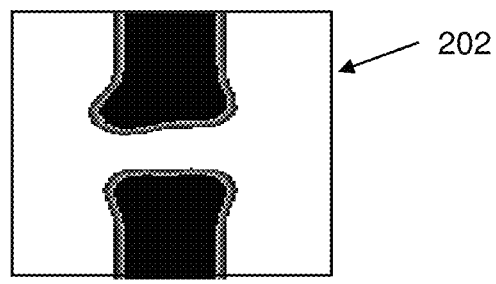
FIG. 6 shows an illustrative inspection image based on reticle-reflected inspection light.

System 100 also includes a controller 140 coupled to sensor 120 and configured to identify a defect in reticle 101 based on at least one of mirror-reflected transmission inspection image 200 (FIG. 5) and reticle-reflected inspection image 202 (FIG. 6). Controller 140 may include any now known or later developed digital image analysis tool configured to identify defects in reticle 101, e.g., circuit patterns 108 that are not shaped, sized, positioned, etc., correctly to print. The inspection may include algorithmic and/or comparison calculations.

System 100 may also include any variety of any variety of optics, e.g., focusing lenses, etc., necessary for operation. For example, one or more focusing optical lens(es) 130 may be positioned between inspection light source 102 and reticle 101. In another example, used in combination with lenses 130 or alone, one or more imaging optical lenses 132 may be positioned between reticle 101 and sensor 120. Lens(es) 130, 132 may include any now known or later developed optics for shaping, focusing, etc., inspection light 104 before it impacts reticle 101. Controller 140 may control operation of lens(es) 130, 132 in a known fashion.

In one embodiment, mirror 124 may be mounted on a mirror adjustment mount 150 operatively coupled to controller 140 and configured to adjust: a distance D (FIGS. 3 and 4) of concave spherical mirror 124 from reticle 101, and/or a shape of concave spherical mirror 124. In one embodiment, mirror adjustment mount 150 may include any motorized system to change distance D. Further, mirror adjustment system 150 may include any motorized system to change shape of mirror 124, e.g., with a flexible surface mirror, a radius of curvature of the mirror can be selectively changed. In alternative embodiments, various concave spherical mirrors 124 configured for different distances and/or having different shapes may be provided for selective use with different reticles 101.

In operation according to embodiments of a method for inspecting reticle 101 for a defect, as shown in FIG. 3, system 100 may transmit inspection light 128 through first side 112 of reticle 101. As noted, inspection light 104 includes DUV light. System 100 may also use sensor 120 to create reticle-reflected inspection image 202 (FIG. 6) representative of circuit pattern 108 of reticle 101 based on a reflection of transmitted inspection light, i.e., reticle-reflected inspection light 136 from first side 112 of reticle 101. System 100 may also, through use with concave spherical mirror 124, reflect transmitted inspection light 104 having passed through first side 112 of reticle 101 through second side 122 of the reticle, creating mirror-reflected transmission inspection light 126. Sensor 120 may create mirror-reflected transmission inspection image 200 (FIG. 5) representative of circuit pattern 108 of reticle 101 based on mirror-reflected transmission inspection light 126. As noted, sensor 120 may differentiate light for creating the first inspection image of the reticle and light for creating the second inspection image based on a difference in a travel time of the inspection light for each. Controller 140 may identify a defect in reticle 101, e.g., a mis-sized circuit pattern, based on at least one of the inspection image(s) 200, 202.

Prior to or during sensing, system 100 may also adjust distance D of concave spherical mirror 124 from reticle 101, and/or a shape of concave spherical mirror 124, using mirror adjustment mount 150.

As shown in FIGS. 2-4, as an optional embodiment, system 100 may include a polarization switch 170 configured to convert inspection light 104 prior to impacting reticle 101 to one of: a circular polarization light, a transverse electric (TE) polarization light and a transverse magnetic (TM) polarization light. Such conversion may improve resolution of reticle-reflected inspection image 202 (FIG. 6). Where polarization switch 170 converts inspection light 104, controller 140 may create only reticle-reflected inspection image 202 (FIG. 6) representative of the circuit pattern of the reticle 101 based on the reflection of reticle-reflected inspection light 136 from first side 112 of reticle 101. However, in other embodiments, the light conversion may be applied relative to either or both inspection images.

Reticle inspection system 100 can obtain inspection images (FIGS. 5 and 6) of circuit pattern 108 of reticle 101 after reflection therefrom and/or transmission of the inspection light therethrough using concave spherical mirror 124. In contrast to conventional systems, reticle inspection system 100 is simpler, and does not exhibit the intensity losses of conventional reticle inspection systems, resulting in more robust identification of defects.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A reticle inspection system, comprising:
    an inspection light source providing an inspection light, the inspection light being deep ultraviolet (DUV) light;
    a reticle holder configured to hold a reticle in a path of the inspection light such that the inspection light impacts the reticle on a first side;
    a concave spherical mirror positioned adjacent a second side of the reticle opposite the first side of the reticle, the concave spherical mirror configured to reflect the inspection light transmitted through the reticle back towards and through the reticle;
    a sensor configured to create at least one of: a first inspection image representative of a circuit pattern of the reticle based on transmission of the inspection light through the first side of the reticle and a reflection thereof by the concave spherical mirror through the second side of the reticle, and a second inspection image representative of the circuit pattern of the reticle based on the reflection of the inspection light from the first side of the reticle; and
    a controller coupled to the sensor and configured to identify a defect in the reticle based on at least one of the first inspection image and the second inspection image.

2. The reticle inspection system of claim 1, further comprising at least one light focusing optical lens between the inspection light source and the reticle.

3. The reticle inspection system of claim 1, further comprising at least one imaging optical lens between the reticle and the sensor.

4. The reticle inspection system of claim 1, further comprising a mirror adjustment mount operatively coupled to the controller and configured to adjust at least one of: a distance of the concave spherical mirror from the reticle, and a shape of the concave spherical mirror.

5. The reticle inspection system of claim 1, wherein the sensor differentiates light for creating the first inspection image of the reticle and light for creating the second inspection image based on a difference in a travel time of the inspection light for each.

6. The reticle inspection system of claim 1, wherein the reticle is a deep ultraviolet (DUV) reticle.

7. The reticle inspection system of claim 1, further comprising a polarization switch configured to convert the inspection light prior to impacting the reticle to one of: a circular polarization light, a transverse electric (TE) polarization light and a transverse magnetic (TM) polarization light.

8. The reticle inspection system of claim 7, wherein in response to the polarization switch converting the inspection light, the controller creates only the second inspection image representative of the circuit pattern of the reticle based on the reflection of the inspection light from the first side of the reticle.

9. A method for inspecting a reticle for a defect, the method comprising:
    transmitting an inspection light through a first side of the reticle, the inspection light including deep ultraviolet (DUV) light;
    creating a first inspection image representative of a circuit pattern of the reticle based on a reflection of the transmitted inspection light from the first side of the reticle;
    using a concave spherical mirror, reflecting the transmitted inspection light having passed through the first side of the reticle through a second side of the reticle, creating a reflected transmitted inspection light;
    creating a second inspection image representative of the circuit pattern of the reticle based on the reflected transmitted inspection light; and
    identifying a defect in the reticle based on at least one of the first inspection image and the second inspection image.

10. The method of claim 9, further comprises converting the inspection light prior to impacting the reticle to one of: a circular polarization light, a transverse electric (TE) polarization light and a transverse magnetic (TM) polarization light.

11. The method of claim 9, further comprising adjusting at least one of a distance of the concave spherical mirror from the reticle, and a shape of the concave spherical mirror.

12. The method of claim 9, wherein the sensor differentiates light for creating the first inspection image of the reticle and light for creating the second inspection image based on a difference in a travel time of the inspection light for each.

* * * * *